(12) United States Patent
Ratcliff et al.

(10) Patent No.: US 12,206,283 B2
(45) Date of Patent: Jan. 21, 2025

(54) SYSTEMS AND METHODS FOR OPERATING AN UNINTERRUPTIBLE POWER SUPPLY (UPS)

(71) Applicant: Vertiv Corporation, Columbus, OH (US)

(72) Inventors: Gregory Wade Ratcliff, Delaware, OH (US); Xian Chen, Lewis Center, OH (US)

(73) Assignee: VERTIV CORPORATION, Westerville, OH (US)

( * ) Notice: Subject to any disclaimer, the term of this patent is extended or adjusted under 35 U.S.C. 154(b) by 215 days.

(21) Appl. No.: 17/890,371

(22) Filed: Aug. 18, 2022

(65) Prior Publication Data
US 2023/0058139 A1 Feb. 23, 2023

Related U.S. Application Data

(60) Provisional application No. 63/235,254, filed on Aug. 20, 2021.

(51) Int. Cl.
*H02J 9/06* (2006.01)
*G06F 1/28* (2006.01)
*G06F 1/30* (2006.01)

(52) U.S. Cl.
CPC ............... *H02J 9/068* (2020.01); *G06F 1/28* (2013.01); *G06F 1/30* (2013.01); *H02J 9/062* (2013.01)

(58) Field of Classification Search
CPC .. H02J 9/062; H02J 9/068; H02J 7/345; H02J 7/0029; H02J 7/0047; G06F 1/28; G06F 1/30; G01R 31/016; G01R 31/64
See application file for complete search history.

(56) References Cited

U.S. PATENT DOCUMENTS 5,118,962 A * 6/1992 Ishii .................... H02J 9/061
307/64
6,054,864 A 4/2000 Butts
(Continued)

FOREIGN PATENT DOCUMENTS

CN 201892699 7/2011
CN 112559279 3/2021
(Continued)

OTHER PUBLICATIONS

International Search Report and Written Opinion for International Application No. PCT/ US2022/040731 dated Dec. 14, 2022.

*Primary Examiner* — Rexford N Barnie
*Assistant Examiner* — Rasem Mourad
(74) *Attorney, Agent, or Firm* — Suiter Swantz IP

(57) ABSTRACT

In some embodiments, apparatuses and methods are provided herein useful to operating uninterruptible power supplies (UPS). The embodiments may include a plurality of capacitor banks, a UPS control circuit, and a central control circuit. The UPS control circuit is configured to cause an output of a clean electrical power, sample the clean electrical power, calculate control algorithm outputs based on the sampled clean electrical power, and output control algorithm results to the central control circuit. The central control circuit configured to detect a degradation of the plurality of capacitor banks, and transmit a service alert in response to the detection of the degradation of the plurality of capacitor banks.

18 Claims, 3 Drawing Sheets

(56) References Cited

U.S. PATENT DOCUMENTS

| | | |
|---|---|---|
| 7,830,269 B2 | 11/2010 | Cheng |
| 8,069,000 B2 | 11/2011 | Kim |
| 8,090,548 B2 | 1/2012 | Abdennadher |
| 8,183,874 B2 | 5/2012 | Dommaschk |
| 8,461,849 B1 * | 6/2013 | Almonte ............ G01R 31/016 |
| | | 324/548 |
| 8,466,689 B2 | 6/2013 | Younsi |
| 8,796,982 B2 | 8/2014 | Li |
| 8,829,919 B2 | 9/2014 | Alho |
| 9,054,589 B2 | 6/2015 | Cheng |
| 9,294,005 B2 | 3/2016 | Tallam |
| 9,494,657 B2 | 11/2016 | Khan |
| 9,653,984 B2 | 5/2017 | Patel |
| 9,667,128 B2 | 5/2017 | Patel |
| 10,551,444 B2 * | 2/2020 | Sebald ................ G01R 31/40 |
| 2002/0138775 A1 * | 9/2002 | Hammond ....... H02J 13/00028 |
| | | 713/310 |
| 2009/0201703 A1 * | 8/2009 | Klikic .................. H02M 7/538 |
| | | 363/41 |
| 2010/0070212 A1 | 3/2010 | Williams |
| 2010/0161259 A1 * | 6/2010 | Kim ................... G05B 23/0283 |
| | | 324/120 |
| 2012/0001764 A1 * | 1/2012 | Naiva ..................... H02H 3/04 |
| | | 361/160 |
| 2016/0313387 A1 | 10/2016 | Schweizer |
| 2016/0357895 A1 * | 12/2016 | Hyde ...................... G06N 7/01 |
| 2020/0011919 A1 * | 1/2020 | Mouridsen ............. H02J 7/345 |
| 2020/0363480 A1 | 11/2020 | Schnell |

FOREIGN PATENT DOCUMENTS

| | | | |
|---|---|---|---|
| CN | 112559279 A | * | 3/2021 |
| DE | 102012105198 | | 12/2013 |
| JP | H05215800 | | 8/1993 |
| WO | 2014098800 | | 6/2014 |
| WO | 2021094928 | | 5/2021 |

* cited by examiner

SYSTEMS AND METHODS FOR OPERATING AN UNINTERRUPTIBLE POWER SUPPLY (UPS)

CROSS REFERENCE TO RELATED APPLICATION

The present application claims priority from U.S. provisional application Ser. No. 63/235,254, filed Aug. 20, 2021, the disclosure of which is hereby incorporated by reference in its entirety into the present disclosure.

TECHNICAL FIELD

This invention relates generally to operating an uninterruptible power supply (UPS), and more specifically to monitoring capacitor health condition of the UPS.

BACKGROUND

Generally, uninterruptible power supplies (UPS) are used to provide backup power and clean power to electrically powered devices during power interruptions. These UPSs typically include banks of capacitors for filtering and rectifying main power supply. Failures of capacitors can be costly in terms of replacement of component costs, labor for inspections and replacement, as well as downtime and/or interruptions to the affected UPS and any associated electrically powered devices.

BRIEF DESCRIPTION OF THE DRAWINGS

Disclosed herein are embodiments of systems, apparatuses and methods pertaining to monitoring capacitor health condition of uninterruptible power supplies (UPS). This description includes drawings, wherein.

Figure 1:
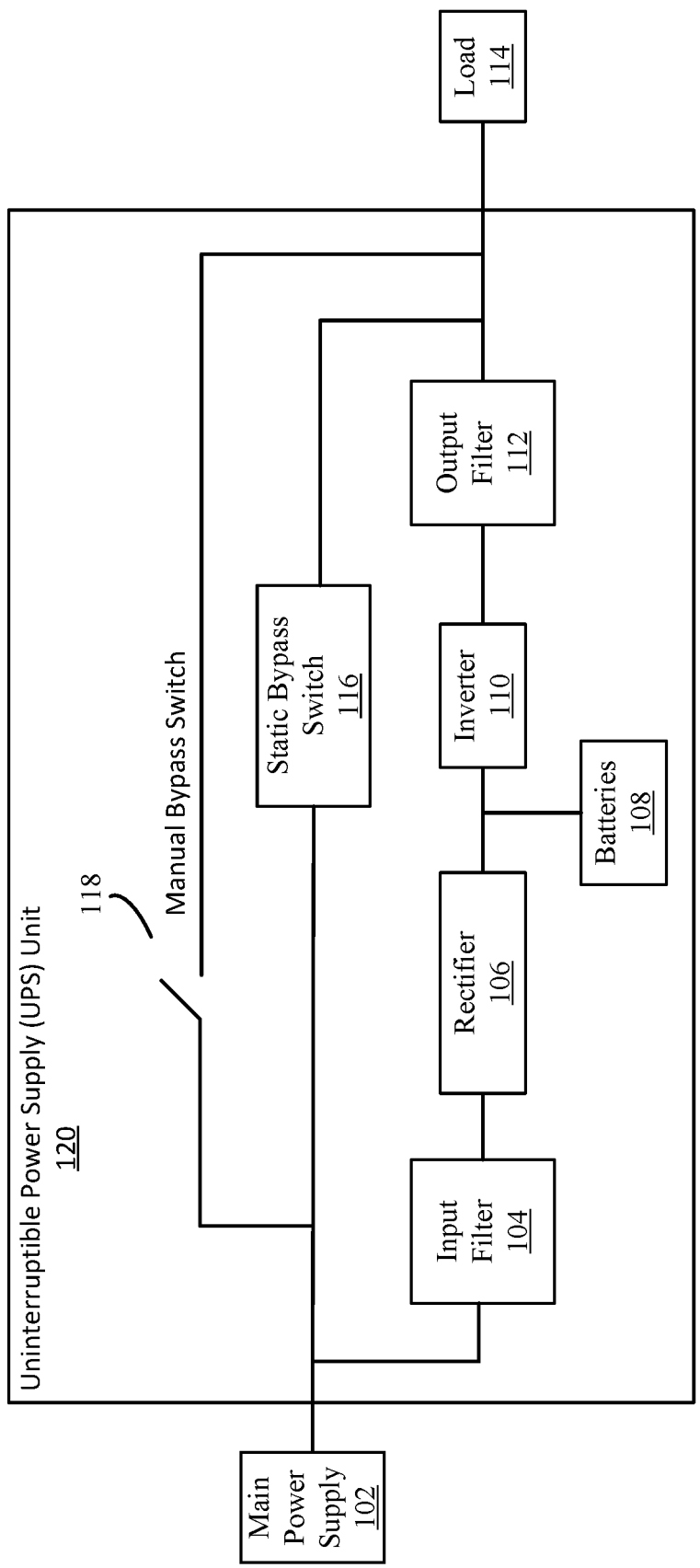
FIG. 1 illustrates a simplified block diagram of an exemplary uninterruptible power supply (UPS) unit in accordance with some embodiments.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to various embodiments, systems, apparatuses and methods are provided herein useful for operating uninterruptible power supplies (UPS) including a plurality of capacitor banks, a UPS control circuit, a central control circuit, and a display unit. The system includes a UPS control circuit that may cause an output of a clean electrical power, sample the clean electrical power at a predetermined sample rate, calculate control algorithm outputs based on the sampled clean electrical power, and output the control algorithm results to the central control circuit. In some embodiments, the system includes a database that stores a plurality of measurements, coefficients, and control data associated with a plurality of UPS units. The central control circuit may execute a machine learning algorithm stored in a memory, cause the machine learning algorithm to be executed with the plurality of measurements, coefficients, and control data as input, cause the machine learning algorithm to output a machine learning model trained to automatically detect degradation of the plurality of capacitor banks beyond a health threshold, and transmit a service alert to a display unit in response to the detection of the degradation of the plurality of capacitor banks. The display unit may display the service alert prompting a user to provide a maintenance service to the plurality of capacitor banks.

In some embodiments, a method for operating uninterruptible power supplies (UPS) includes causing, by a UPS control circuit, output of a clean electrical power; sampling, by the UPS control circuit, the clean electrical power at a predetermined sample rate; calculating, by the UPS control circuit, control algorithm outputs based on the sampled clean electrical power; outputting, by the UPS control circuit, control algorithm results to the central control circuit; storing, by a database, a plurality of measurements, coefficients, and control data associated with a plurality of UPS units; executing, by a central control circuit, a machine learning algorithm stored in a memory; causing, by the central control circuit, the machine learning algorithm to be executed with the plurality of measurements, coefficients, and control data as input; causing, by the central control circuit, the machine learning algorithm to output a machine learning model trained to automatically detect degradation of the plurality of capacitor banks beyond a health threshold; transmitting, by the central control circuit, a service alert to a display unit in response to the detection of the degradation of the plurality of capacitor banks; and displaying, by the display unit, the service alert prompting a user to provide a maintenance service to the plurality of capacitor banks.

FIG. 1 illustrates a simplified block diagram of an exemplary uninterruptible power supply (UPS) unit 120 in accordance with some embodiments. The UPS unit 120 includes input filter 104, rectifier 106, batteries 108, inverter 110, output filter 112, and/or static bypass switch 116. The input filter 104 receives input power from a main power supply 102. As depicted, the main power supply 102 includes single-phase power. However, the embodiments described may apply to other types of alternating current (AC) power such as 120 VAC/60 Hz, 230 VAC/50 Hz, single-phase, and/or three-phase power. The input filter 104 receives an alternating current electric power from the main power supply 102 and includes a plurality of capacitor banks that smooth out input transients and reduce harmonic distortion. The output filter 112 may couple to a load 114 and include a plurality of capacitor banks to smooth out voltage fluctuations on an AC output provided by the inverter 110 prior to powering the load 114. In some embodiments, the rectifier 106 may convert the input power from AC to direct current (DC). By one approach, the rectifier 106 may recharge the batteries 108. In some embodiments, the batteries 108 may provide emergency power when the main power supply 102 fails. In some configurations, the rectifier 106 and/or a separate charger (not shown) may ensure that the batteries 108 are charged. In some configurations, the batteries 108 may be internal to the UPS unit 120 or may be external to the UPS unit 120. The inverter 110 may switch the DC voltage from the rectifier 106 or the batteries 108 to an AC output that powers the load 114. The load 114 may include one or more electrically powered devices used, for example, in Information Technology (IT) applications (e.g., computer room and data center environments), hospitals, power plants, and/or oil rigs, to name a few. The static bypass switch 116 is configured to automatically connect the load 114 to the main power supply 102, bypassing the input filter 104, the rectifier 106, the batteries 108, the inverter 110, and/or the output filter 112 in case of a failure within the UPS unit 120. In some embodiments, a manual bypass switch 118 is engaged, for example, prior to servicing the UPS unit 120. For example, the manual bypass switch 118 may enable the UPS unit 120 to be removed and/or replaced without interrupting the load 114.

Figure 2:
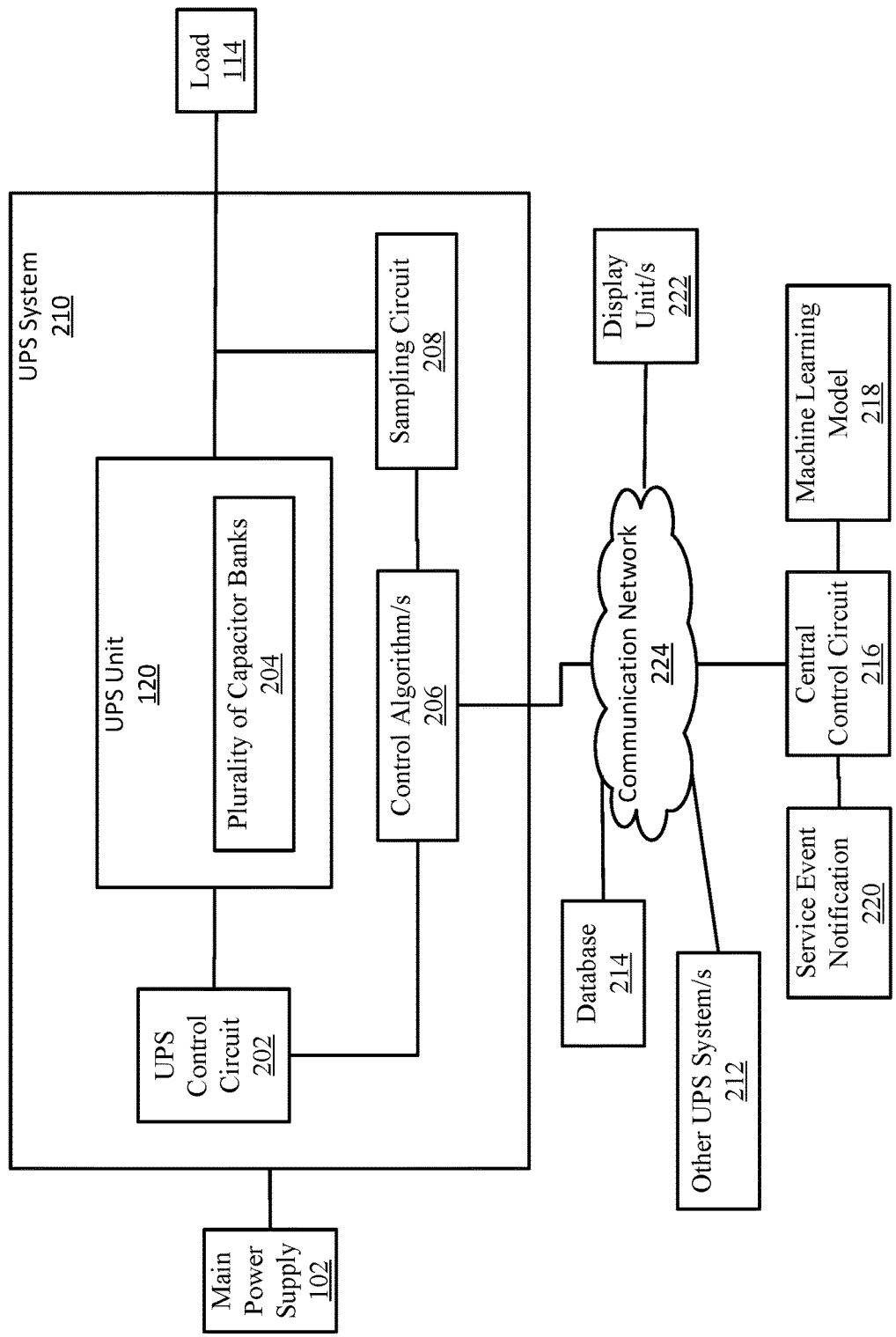
FIG. 2 is a simplified schematic illustration of an exemplary UPS system in accordance with some embodiments.

FIG. 2 is a simplified schematic illustration of an exemplary UPS system 210 in accordance with some embodiments. The UPS system 210 includes the UPS unit 120 and a UPS control circuit 202. The UPS unit 120 may include a plurality of capacitor banks 204. In some embodiments, the plurality of capacitor banks 204 may include the plurality of capacitor banks of the input filter 104, the plurality of capacitor banks of the rectifier 106, and/or the plurality of capacitor banks of the output filter 112. The UPS control circuit 202 may include a processor, a microcontroller, and/or a digital signal processor (DSP). In some embodiments, the UPS control circuit 202 may cause an output of a clean electrical power (e.g., a clean three-phase power). For example, the clean electrical power may correspond to the AC output after the output filter 112 filters for and/or smooths out voltage fluctuations. The UPS control circuit 202 may sample the clean electrical power at a predetermined sample rate. In some embodiments, the predetermined sample rate may result in sampling the AC output prior to powering the load 114 at a particular point of the AC output. The UPS control circuit 202 may calculate control algorithm outputs based on the sampled clean electrical power. Alternatively, or in addition to, the UPS control circuit 202 may output control algorithm results to the central control circuit 216. In some embodiments, the central control circuit 216 is distinct and/or remote from the UPS units 120, UPS system 210, and/or other UPS system/s 212. In some configurations, a UPS unit (e.g., the UPS unit 120) and a UPS system (e.g., the UPS system 210) may be interchangeably referring to a UPS unit having a UPS control circuit 202 capable of controlling one or more components shown in the UPS unit 120 of FIG. 1. In some configurations, the central control circuit 216 may receive, at a particular and/or predetermined time, each of a plurality of measurements, coefficients, and control data from each UPS unit coupled to a communication network 224. In some configurations, the central control circuit 216 may cause the database 214 to store the plurality of measurements, coefficients, and control data.

In some embodiments, the UPS system 210 includes a sampling circuit 208. In some embodiments, the sampling circuit 208 includes one or more circuits, test points, and/or electrical components configured to sample the AC output prior to powering the load 114 at a particular/predetermined sampling rate. In some embodiments, the particular/predetermined sampling rate may include 6 kilohertz (kHz), 8 kHz (8000 times per second) and/or greater and/or at a predetermined incremental period, and/or at a switching frequency greater than 5 kHz, and/or any suitable switching frequency based on electrical components implemented. In some embodiments, the UPS system 210 may include control algorithm/s 206 stored in a memory accessible by the UPS system 210 and executed by the UPS control circuit 202. The UPS control circuit 202 may execute the control algorithm/s 206 to calculate control algorithm outputs based in part on the sampled clean electrical power and/or measurement and coefficient data provided by one or more circuits, test points, and/or electrical components configured to determine charge and discharge cycles of the plurality of the capacitor banks 204, charge and discharge durations of the plurality of the capacitor banks 204, capacitor operating voltage, a number of events when a reverse voltage is applied across the plurality of capacitor banks 204, a number of events when a voltage greater than a voltage threshold is applied across the plurality of capacitor banks 204, a ripple current value, an internal control coefficient, capacitance value, ambient temperature, capacitor temperature, and/or internal coefficients that infer the health of the capacitor determined based on historical values previously retrieved. The UPS control circuit 202 may output control algorithm results corresponding to the calculated control algorithm outputs to the central control circuit 216. In some embodiments, the database 214 stores a plurality of measurements, coefficients, and control data associated with a plurality of UPS units including the control algorithm results and/or the measurement and coefficient data. In some embodiments, one or more values associated with the measurements, coefficients, and control data may include one or more atypical values with respect to the normal operating values of the plurality of the capacitor banks 204 and/or a sampling of values of one or more particular capacitors of the plurality of the capacitor banks 204. For example, the capacitor operating voltage may be determined by measurement of the UPS system 210 at half load. In another example, the ripple current value may be determined at a node at the output filter 112 prior to the AC output being received at the load 114. In some embodiments, a failure or behavior preceding the failure of an individual capacitor or bank of capacitors may affect the performance of a capacitor bank, which can be detected by embodiments of the present disclosure. For example, the one or more atypical values stored in the database 214 may be detected by a machine learning algorithm.

In some embodiments, the UPS control circuit 202 may output the control algorithm results to a central control circuit 216 and/or cause a database 214 to store the output control algorithm results. In some embodiments, the central control circuit 216 may include a computer, a computer cluster, and/or a server. The central control circuit 216 may execute a machine learning algorithm stored in a memory (not shown). In some embodiments, the memory may include a random access memory, a read only memory, a solid state drive, a hard drive, a cloud storage, and/or any electronic components capable of storing electronic and/or computer data. The central control circuit 216 may cause the machine learning algorithm to be executed with values and/or data associated with the plurality of measurements, coefficients, and control data as input. The central control circuit 216 causes the machine learning algorithm to output a machine learning model 218 trained to automatically detect degradation of the plurality of capacitor banks 204 beyond a health threshold and/or a health score.

In some embodiments, the machine learning algorithm includes a supervised learning, an unsupervised learning, a reinforcement learning, binary classification, Support Vector Machine (SVM), artificial neural networks, convolutional neural networks, Fast-RCNN, Faster-RCNN, and Mask RCNN, and/or any one or more open-sourced machine learning algorithm available to the public for download and use. Those skilled in the art will recognize that the embodiments described herein can use one or more publicly known and/or privately created machine learning algorithm without departing from the scope of the invention. Additionally, those skilled in the art will recognize that the embodiments described herein improve on the accuracy of the trained machine learning model 218 on automatically detecting degradation of the plurality of capacitor banks 204 beyond a health threshold.

In an illustrative non-limiting example, the central control circuit 216 trains the machine learning algorithm based on values and/or data associated with the plurality of measurements, coefficients, and control data that are stored in the database 214. In some embodiments, the machine learning algorithm uses one or more of the plurality of measurements, coefficients, and control data that include measurement, coefficients, and control data obtained, sampled, and/or determined from the UPS system 210 and/or other UPS system/s 212 that are functioning normally and/or abnormally (e.g., one or more values and/or data associated with the plurality of measurements, coefficients, and control data are above and/or below predetermined thresholds) and/or proximate to having one or more banks of capacitors that fail. In some embodiments, the central control circuit 216 may execute the machine learning model 218 and periodically and/or at a particular time analyze values and/or data associated with the plurality of measurements, coefficients, and control data of the UPS system 210 to detect degradation of the plurality of capacitor banks 204. In some embodiments, the central control circuit 216 may transmit a service alert and/or a service event notification 220 to a display unit/s 222 in response to the detection of the degradation of the plurality of capacitor banks 204. For example, the display unit/s 222 may display the service alert prompting a user to provide a maintenance service to the plurality of capacitor banks 204. In some embodiments, the maintenance service may correspond to a data-driven maintenance/service model that augments an existing calendar-driven and/or alarm-driven service models. One of the advantages of the present disclosure is that maintenance of a UPS system and/or UPS unit is data-driven and that service and/or maintenance of the UPS system and/or UPS unit and/or the plurality of capacitor banks is proactively performed rather than reactively waiting for a next service visit (e.g., the calendar-driven service model) and/or after failure and/or a near failure service visit (e.g., the alarm-driven service model). As such, one of the resulting benefits of a data-driven maintenance/service model is providing extra flexibility in meeting a customer's and/or a user's need for reliable and cost-effective operation of the load 114 that the UPS system and/or UPS unit is coupled to. In some embodiments, the central control circuit 216 may communicate to the database 214, other UPS system/s 212, the UPS system 210, the UPS control circuit 202, and/or the display unit/s 222 via a communication network 224. The communication network 224 may include Internet, wide area network (WAN), local area network (LAN), and/or wired and/or wireless networks. In some embodiments, the display unit/s 222 may be proximate to and/or directly coupled to the central control circuit 216.

Figure 3:
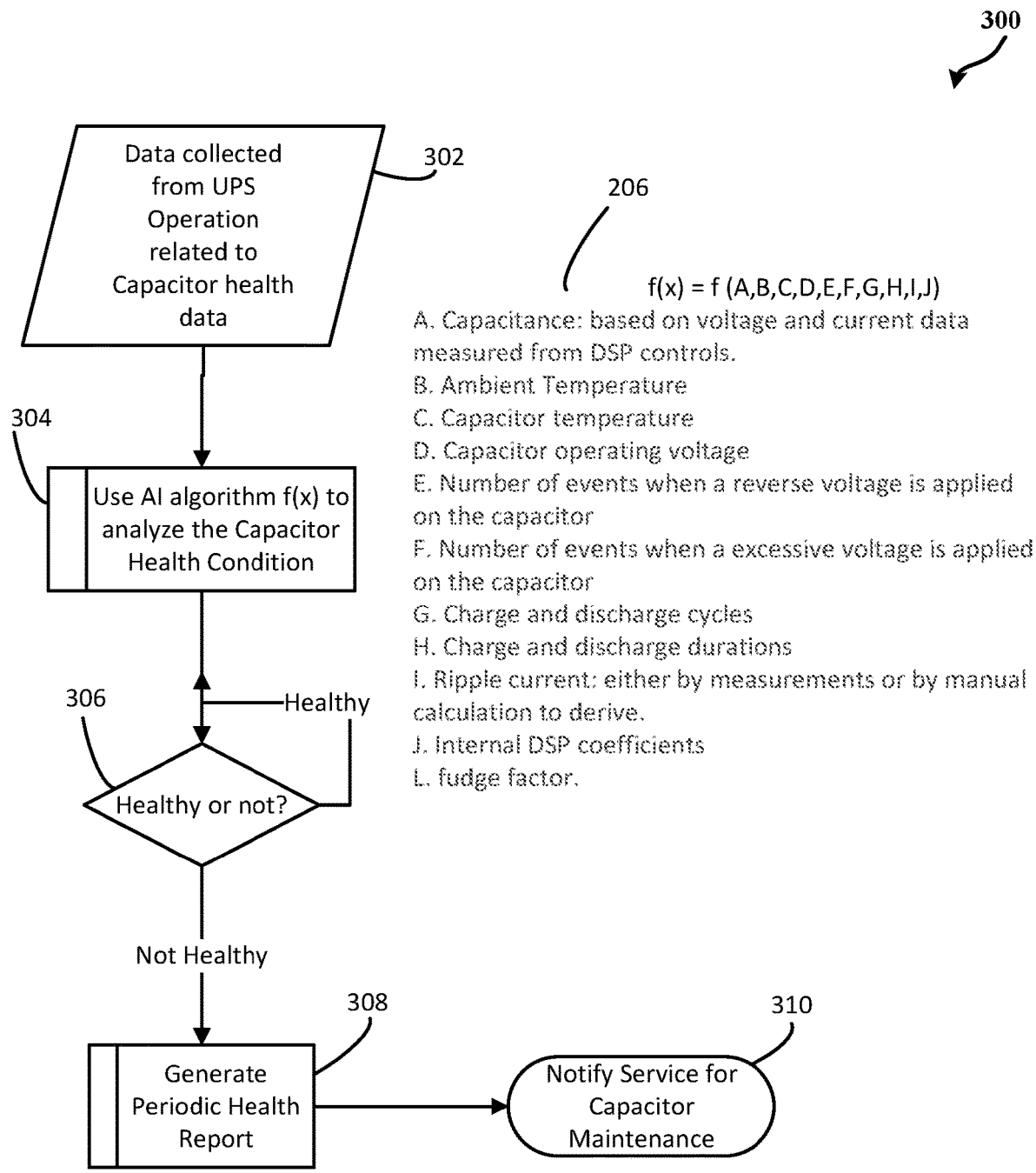
FIG. 3 shows a flow diagram of an exemplary process of operating UPS in accordance with some embodiments.

FIG. 3 shows a flow diagram of an exemplary process and/or method 300 for operating a UPS in accordance with some embodiments. In some embodiments, at step 302, data and/or values relating to capacitor health data are collected from UPS operations of one or more UPS system 210, 212. The capacitor health data and/or condition may be determined based on the processing and/or analysis of the values and/or data associated with the plurality of measurements, coefficients, and control data by the central control circuit 216. The plurality of measurements, coefficients, and control data may be associated with capacitance data based on recently and/or historically measured voltage and current data, ambient temperature (e.g., temperature data surrounding the UPS system 210, 212), capacitor temperature, capacitor operating voltage, number of events when a reverse voltage is applied on one or more capacitors of the plurality of capacitor banks 204, number of events when an excessive voltage is applied on one or more capacitors of the plurality of capacitor banks 204, charge and discharge cycles, charge and discharge durations, ripple current (e.g., ripple current measured by measurement instruments and/or circuits and/or by manual calculation), internal control coefficients, and/or the internal coefficient.

In some embodiments, at step 304, the central control circuit 216 may use an artificial intelligence (AI) algorithm f(x) to analyze the capacitor health condition. For example, the AI algorithm f(x) may include the machine learning model 218. At step 306, the central control circuit 216 may determine whether the processing of and/or analysis of the capacitor health condition indicates that one or more capacitors associated with a corresponding UPS system are healthy or not. In some embodiments, when the central control circuit 216 determines that the one or more capacitors are healthy, the central control circuit 216 may initiate a determination of the capacitor health condition of a UPS system at a later time and/or at a predetermined time period based on most recent and/or real-time values and/or data associated with the plurality of measurements, coefficients, and control data of the UPS system. In some embodiments, when the central control circuit 216 determines that the one or more capacitors are not healthy (or are in a condition preceding an unhealthy condition), the central control circuit 216 may, at step 308, generate a periodic health report. In some embodiments, at step 310, the central control circuit 216 notifies service and/or transmits a service alert to a user for capacitor maintenance.

A system for operating uninterruptible power supplies (UPS) comprising: a plurality of capacitor banks; a UPS control circuit coupled to the plurality of capacitor banks, the UPS control circuit configured to: cause an output of a clean electrical power; sample the clean electrical power at a predetermined sample rate; calculate control algorithm outputs based on the sampled clean electrical power; and output control algorithm results corresponding to the calculated control algorithm outputs to a central control circuit; and the central control circuit using a trained machine learning model configured to: detect a degradation of the plurality of capacitor banks beyond a health threshold based on the control algorithm results; and transmit a service alert in response to the detection of the degradation of the plurality of capacitor banks.

The system of any preceding clause wherein the control algorithm results comprise charge and discharge cycles of the plurality of capacitor banks, charge and discharge durations of the plurality of capacitor banks, capacitor operating voltage, a number of events when a reverse voltage is applied across the plurality of capacitor banks, a number of events when a voltage greater than a voltage threshold is applied across the plurality of capacitor banks, a ripple current value, an internal control coefficient, capacitance value, ambient temperature, capacitor temperature, and an internal coefficient.

The system of any preceding clause wherein the clean electrical power comprises a three-phase power.

The system of any preceding clause wherein the predetermined sample rate comprises a switching frequency greater than 5 kilohertz (kHz).

The system of any preceding clause wherein each UPS unit of a plurality of UPS units comprises the plurality of capacitor banks and the UPS control circuit, and wherein the central control circuit is distinct and remote from the plurality of UPS units and further configured to: receive each of a plurality of measurements, coefficients, and control data from each UPS unit at a particular time; and cause a database to store the plurality of measurements, coefficients, and control data.

The system of any preceding clause wherein the control algorithm results comprise capacitor operating voltages associated with each UPS unit of a plurality of UPS units at half load.

The system of any preceding clause wherein the control algorithm results comprise ripple current values associated with each UPS unit of a plurality of UPS units measured at an output filter of the UPS unit prior to a receipt of an alternating current (AC) output at a load.

The system of any preceding clause further comprising a display unit configured to display the service alert prompting a user to provide a maintenance service to the plurality of capacitor banks.

The system of any preceding clause wherein the maintenance service comprises a data-driven maintenance or service model that augments an existing calendar-driven or alarm-driven service models.

The system of any preceding clause further comprising: a database configured to store a plurality of measurements, coefficients, and control data associated with a plurality of UPS units, wherein the central control circuit is further configured to: execute a machine learning algorithm stored in a memory; cause the machine learning algorithm to be executed with the plurality of measurements, coefficients, and control data as input; and cause the machine learning algorithm to output the trained machine learning model trained to automatically detect the degradation of the plurality of capacitor banks.

A method for operating uninterruptible power supplies (UPS) comprising: causing, by a UPS control circuit coupled to a plurality of capacitor banks, an output of a clean electrical power; sampling, by the UPS control circuit, the clean electrical power at a predetermined sample rate; calculating, by the UPS control circuit, control algorithm outputs based on the sampled clean electrical power; outputting, by the UPS control circuit, control algorithm results corresponding to the calculated control algorithm outputs to a central control circuit; detecting, by the central control circuit using a trained machine learning model, a degradation of the plurality of capacitor banks beyond a health threshold based on the control algorithm results; and transmitting, by the central control circuit, a service alert in response to the detection of the degradation of the plurality of capacitor banks.

The method of any preceding clause wherein the control algorithm results comprise charge and discharge cycles of the plurality of capacitor banks, charge and discharge durations of the plurality of capacitor banks, capacitor operating voltage, a number of events when a reverse voltage is applied across the plurality of capacitor banks, a number of events when a voltage greater than a voltage threshold is applied across the plurality of capacitor banks, a ripple current value, an internal control coefficient, capacitance value, ambient temperature, capacitor temperature, and an internal coefficient.

The method of any preceding clause wherein the clean electrical power comprises a three-phase power.

The method of any preceding clause wherein the predetermined sample rate comprises a switching frequency greater than 5 kilohertz (kHz).

The method of any preceding clause further comprising: receiving, by the central control circuit, each of a plurality of measurements, coefficients, and control data from each UPS unit of a plurality UPS units at a particular time; and causing, by the central control circuit, a database to store the plurality of measurements, coefficients, and control data, wherein each UPS unit comprises the plurality of capacitor banks and the UPS control circuit, and wherein the central control circuit is distinct and remote from the plurality of UPS units.

The method of any preceding clause wherein the control algorithm results comprise capacitor operating voltages associated with each UPS unit of a plurality of UPS units at half load.

The method of any preceding clause wherein the control algorithm results comprise ripple current values associated with each UPS unit of a plurality of UPS units measured at an output filter of the UPS unit prior to a receipt of an alternating current (AC) output at a load.

The method of any preceding clause further comprising displaying, by a display unit, the service alert prompting a user to provide a maintenance service to the plurality of capacitor banks.

The method of any preceding clause wherein the maintenance service comprises a data-driven maintenance or service model that augments an existing calendar-driven or alarm-driven service models.

The method of any preceding clause further comprising: storing, by a database, a plurality of measurements, coefficients, and control data associated with a plurality of UPS units; executing, by the central control circuit, a machine learning algorithm stored in a memory; causing, by the central control circuit, the machine learning algorithm to be executed with the plurality of measurements, coefficients, and control data as input; and causing, by the central control circuit, the machine learning algorithm to output the trained machine learning model trained to automatically detect the degradation of the plurality of capacitor banks.

Those skilled in the art will recognize that a wide variety of other modifications, alterations, and combinations can also be made with respect to the above described embodiments without departing from the scope of the present disclosure, and that such modifications, alterations, and combinations are to be viewed as being within the ambit of the inventive concept.

What is claimed is:
1. A system for operating uninterruptible power supplies (UPSs), the system comprising:
a plurality of capacitor banks;
a UPS control circuit coupled to the plurality of capacitor banks, the UPS control circuit configured to:
cause an output of a clean electrical power, wherein the clean electrical power corresponds to an electrical power having voltage fluctuations smoothed out;

sample the clean electrical power at a predetermined sample rate;

calculate control algorithm outputs based on the sampled clean electrical power; and output control algorithm results corresponding to the calculated control algorithm outputs to a central control circuit, wherein the central control circuit is remote and distinct from the UPS control circuit; and the central control circuit executing a trained machine learning model configured to:

detect a degradation of the plurality of capacitor banks beyond a health threshold based on the control algorithm results such that the trained machine learning model detects the degradation as a function of at least a number of events when a reverse voltage is applied on the plurality of capacitor banks and a number of events when an excessive voltage is applied on the plurality of capacitor banks; and transmit a service alert in response to the detection of the degradation of the plurality of capacitor banks.

2. The system of claim 1, wherein the detection of the degradation is further a function of charge and discharge cycles of the plurality of capacitor banks, charge and discharge durations of the plurality of capacitor banks, capacitor operating voltage, a ripple current value, an internal control coefficient, capacitance value, ambient temperature, capacitor temperature, and an internal coefficient.

3. The system of claim 1, wherein the clean electrical power comprises a three-phase power.

4. The system of claim 1, wherein the predetermined sample rate comprises a switching frequency greater than 5 kilohertz (kHz).

5. The system of claim 1, wherein each UPS unit of a plurality of UPS units comprises the plurality of capacitor banks and the UPS control circuit, and wherein the central control circuit is distinct and remote from the plurality of UPS units and further configured to:

receive each of a plurality of measurements, coefficients, and control data from each UPS unit at a particular time; and cause a database to store the plurality of measurements, coefficients, and control data.

6. The system of claim 1, wherein the control algorithm results comprise capacitor operating voltages associated with each UPS unit of a plurality of UPS units at half load.

7. The system of claim 1, wherein the control algorithm results comprise ripple current values associated with each UPS unit of a plurality of UPS units measured at an output filter of the UPS unit prior to a receipt of an alternating current (AC) output at a load.

8. The system of claim 1, further comprising a display unit configured to display the service alert prompting a user to provide a maintenance service to the plurality of capacitor banks that augments an existing calendar-driven or alarm-driven service model.

9. The system of claim 1, further comprising:

a database configured to store a plurality of measurements, coefficients, and control data associated with a plurality of UPS units, wherein the central control circuit is further configured to:

execute a machine learning algorithm stored in a memory;

cause the machine learning algorithm to be executed with the plurality of measurements, coefficients, and control data as input; and cause the machine learning algorithm to output the trained machine learning model trained to automatically detect the degradation of the plurality of capacitor banks.

10. A method for operating uninterruptible power supplies (UPSs), the method comprising:

causing, by a UPS control circuit coupled to a plurality of capacitor banks, an output of a clean electrical power, wherein the clean electrical power corresponds to an electrical power having voltage fluctuations smoothed out;

sampling, by the UPS control circuit, the clean electrical power at a predetermined sample rate;

calculating, by the UPS control circuit, control algorithm outputs based on the sampled clean electrical power;

outputting, by the UPS control circuit, control algorithm results corresponding to the calculated control algorithm outputs to a central control circuit, wherein the central control circuit is remote and distinct from the UPS control circuit;

detecting, by the central control circuit executing a trained machine learning model, a degradation of the plurality of capacitor banks beyond a health threshold based on the control algorithm results such that the trained machine learning model detects the degradation as a function of at least a number of events when a reverse voltage is applied on the plurality of capacitor banks and a number of events when an excessive voltage is applied on the plurality of capacitor banks; and transmitting, by the central control circuit, a service alert in response to the detection of the degradation of the plurality of capacitor banks.

11. The method of claim 10, wherein the detection of the degradation is further the function of charge and discharge cycles of the plurality of capacitor banks, charge and discharge durations of the plurality of capacitor banks, capacitor operating voltage, a ripple current value, an internal control coefficient, capacitance value, ambient temperature, capacitor temperature, and an internal coefficient.

12. The method of claim 10, wherein the clean electrical power comprises a three-phase power.

13. The method of claim 10, wherein the predetermined sample rate comprises a switching frequency greater than 5 kilohertz (kHz).

14. The method of claim 10, further comprising:

receiving, by the central control circuit, each of a plurality of measurements, coefficients, and control data from each UPS unit of a plurality UPS units at a particular time; and causing, by the central control circuit, a database to store the plurality of measurements, coefficients, and control data, wherein each UPS unit comprises the plurality of capacitor banks and the UPS control circuit, and wherein the central control circuit is distinct and remote from the plurality of UPS units.

15. The method of claim 10, wherein the control algorithm results comprise capacitor operating voltages associated with each UPS unit of a plurality of UPS units at half load.

16. The method of claim 10, wherein the control algorithm results comprise ripple current values associated with each UPS unit of a plurality of UPS units measured at an output filter of the UPS unit prior to a receipt of an alternating current (AC) output at a load.

17. The method of claim 10, further comprising displaying, by a display unit, the service alert prompting a user to provide a maintenance service to the plurality of capacitor banks augmenting an existing calendar-driven or alarm-driven service model.

18. The method of claim 10, further comprising:
- storing, by a database, a plurality of measurements, coefficients, and control data associated with a plurality of UPS units;
- executing, by the central control circuit, a machine learning algorithm stored in a memory;
- causing, by the central control circuit, the machine learning algorithm to be executed with the plurality of measurements, coefficients, and control data as input; and
- causing, by the central control circuit, the machine learning algorithm to output the trained machine learning model trained to automatically detect the degradation of the plurality of capacitor banks.

* * * * *